(12) United States Patent
Ishii et al.

(10) Patent No.: US 8,690,559 B2
(45) Date of Patent: Apr. 8, 2014

(54) NANO-IMPRINTING RESIN STAMPER AND NANO-IMPRINTING APPARATUS USING THE SAME

(75) Inventors: Satoshi Ishii, Hitachi (JP); Masahiko Ogino, Hitachi (JP); Noritake Shizawa, Ninomiya (JP); Kyoichi Mori, Oiso (JP); Akihiro Miyauchi, Hitachi (JP)

(73) Assignee: Hitachi High-Technologies Corporation, Tokyo (JP)

( * ) Notice: Subject to any disclaimer, the term of this patent is extended or adjusted under 35 U.S.C. 154(b) by 256 days.

(21) Appl. No.: 13/193,666

(22) Filed: Jul. 29, 2011

(65) Prior Publication Data

US 2012/0027884 A1     Feb. 2, 2012

(30) Foreign Application Priority Data

Jul. 29, 2010   (JP) ................................ 2010-170379

(51) Int. Cl.
*B29C 43/56* (2006.01)

(52) U.S. Cl.
USPC ........ 425/174.4; 425/174; 425/385; 264/494; 264/496; 264/219; 264/220; 264/225; 264/226; 264/227; 264/293

(58) Field of Classification Search
USPC ............... 425/174, 174.4, 385; 264/494, 496, 264/219, 220, 225, 226, 227, 293
See application file for complete search history.

(56) References Cited

U.S. PATENT DOCUMENTS

| | | | |
|---|---|---|---|
| 2003/0158286 A1* | 8/2003 | Nishizaki et al. | 522/168 |
| 2008/0277826 A1* | 11/2008 | Chou et al. | 264/293 |
| 2009/0256287 A1* | 10/2009 | Fu et al. | 264/447 |
| 2009/0302507 A1 | 12/2009 | Tsunozaki et al. | |
| 2010/0034911 A1* | 2/2010 | Mori et al. | 425/174.4 |
| 2010/0155989 A1* | 6/2010 | Ishii et al. | 425/174.4 |

FOREIGN PATENT DOCUMENTS

| | | |
|---|---|---|
| JP | 2004-351693 | 12/2004 |
| JP | 2009-1002 | 1/2009 |
| JP | 2010-5972 | 1/2010 |

* cited by examiner

*Primary Examiner* — Timothy Kennedy
(74) *Attorney, Agent, or Firm* — Antonelli, Terry, Stout & Kraus, LLP.

(57) ABSTRACT

The present invention provides a nano-imprinting resin stamper including a micro structure layer on a transmissive support basal material, the micro structure layer being formed of a polymer of a resin composition that contains a silsesquioxane derivative as a major constituent having a plurality of polymerizable functional groups, another polymerizable resin component having a plurality of polymerizable functional groups and different from the silsesquioxane derivative, and a photopolymerizable initiator, in which the content percentage of the photopolymerizable initiator is equal to or more than 0.3 mass % and equal to or less than 3 mass % relative to a total mass of the silsesquioxane derivative and the polymerizable resin component, and the micro structure layer permits equal to or more than 80% of light to pass therethrough at a wavelength of 365 nm.

16 Claims, 4 Drawing Sheets

NANO-IMPRINTING RESIN STAMPER AND NANO-IMPRINTING APPARATUS USING THE SAME

CROSS REFERENCE TO RELATED APPLICATION

The application claims the foreign priority benefit under Title 35, United States Code, Section 119(a)-(d) of Japanese Patent Application No. 2010-170379 filed on Jul. 29, 2010, the content of which is hereby incorporated by reference.

BACKGROUND OF THE INVENTION

1. Field of the Invention

The present invention relates to a nano-imprinting resin stamper that is pressed against a transfer target in order to form a micro structure (micropattern) on a surface thereof.

2. Description of the Related Art

Conventionally, a photolithography technique is often used for processing a micropattern that is necessary for semiconductor devices, etc. However, as the pattern becomes finer, it became difficult to cope with such fineness through the photolithography technique when a required processing dimension becomes small to the wavelength of light used for exposure. Therefore, an electron beam lithographic apparatus that is a kind of charged particle radiation apparatuses is recently used instead.

The pattern formation using the electron beam employs a method of directly drawing a mask pattern unlike a one-shot exposure method of the pattern formation using a light source, such as an i-ray and an excimer laser. Consequently, the more the number of patterns to be drawn is, the more it takes a time for exposure (drawing), and thus it takes a longer time to complete the pattern. The higher the integration degree of a semiconductor integrated circuit becomes, the more it requires a time for pattern formation, and thus reduction of a throughput must be concerned.

Hence, in order to speed up the electron beam lithographic apparatus, a one-shot pattern irradiation method is advanced which combines masks of various shapes and emitting electron beams at one time to those combined masks, thereby forming electron beam in a complex shape. In contrast, however, together with the advancement of the finer patterns, the electron beam lithographic apparatus increases its size, the mask position needs to be controlled highly precisely, and the apparatus cost increases.

Conversely, a nano-imprinting technique is known which forms a highly precise pattern at a lower cost. According to the nano imprinting technique, a stamper formed with concavity and convexity (a surface shape) corresponding to a micropattern to be formed is pressed against a transfer target obtained by, for example, forming a resin layer on a predetermined substrate, and the micropattern is transferred on the resin layer and is formed.

Moreover, when a stamper having a light transmissivity is used and pressed against the resin layer formed of a photo-curable resin, and such a resin layer is irradiated with light through the stamper, it is possible to make the resin layer cured.

Application of such nano-imprinting technique to a pattern formation of recording bits on a large-capacity recording medium, and to a pattern formation of semiconductor integrated circuits is discussed.

An example conventional stamper used for nano-imprinting and having a light transmissivity is a hard stamper of silica.

However, the hard stamper of silica has a problem such that it cannot follow a warpage of a transfer target substrate and a bump thereof, developing a transfer failure region across a broad range. Moreover, in order to reduce the transfer failure region, it is required for the stamper to absorb both warpage of the transfer target substrate formed with the resin layer and bump thereof. Hence, in order to follow both warpage of the transfer target substrate and bump thereof, there is proposed a stamper (a soft stamper) formed thickly of a soft resin (see, for example, JP 2010-5972 A). Such a soft stamper is capable of suppressing the transfer failure by following the warpage of the transfer target substrate and the bump thereof using the soft and think resin.

On the other hand, the demolding characteristic from a transfer target is important for the stamper used for the nano-imprinting technique. Conventionally, there is known a technique of applying a fluorine-based demolding agent to the surface of the hard stamper of silica (see, for example, JP 2004-351693 A). Moreover, stampers are also known which use a fluorine-based resin and silicone-based resin (see, for example, JP 2009-1002 A). According to the stamper with the demolding characteristic, the demolding from the transfer target is improved, and thus it is possible to improve the transfer precision of the micropattern to the transfer target.

However, the hard stamper of silica processed by the fluorine-based demolding agent is likely to develop a transfer failure as mentioned above. Moreover, regarding the stampers using the fluorine-based resin and silicone-based resin, the following capability to the warpage of the transfer target substrate and the bump thereof is still insufficient in comparison with the above-explained soft stamper, so that the transfer failure is not avoided sufficiently.

Therefore, the demolding treatment may be applied on the surface of the above-explained stamper.

However, since the soft stamper decreases the light transmissivity as the thickness thereof increases, there is a new problem such that a curing time of the above-explained photo-curable resin layer becomes long when irradiated with light (e.g., ultraviolet light with a wavelength of 365 nm) through the soft stamper. Moreover, the soft stamper that has the light transmissivity decreased reduces the transfer precision due to a thermal expansion originating from light absorbed.

In addition, when the demolding agent is applied on the surface of the soft stamper, the application thickness becomes uneven due to the wettability, etc., which accelerates reduction of the transfer precision. Moreover, the demolding layer formed on the surface of the soft stamper is likely to be deteriorated by repeating the transfer, and thus the so-called repetitive transfer characteristic also becomes insufficient.

Therefore, regarding the light-transmissive stamper used for the nano-imprinting technique, a nano-imprinting resin stamper is desired which has a sufficient light transmissivity for maintaining a good throughput, has an excellent transfer precision of a micropattern to a transfer target, and has an excellent repetitive transfer characteristic.

It is an object of the present invention to provide a nano-imprinting resin stamper which has a sufficient light transmissivity for maintaining a good throughput, has an excellent transfer precision of a micropattern to a transfer target, and has an excellent repetitive transfer characteristic, and a nano-imprinting apparatus using the same.

SUMMARY OF THE INVENTION

The present invention that solves the problems provides a nano-imprinting resin stamper including a micro structure layer on a light-transmissive support basal material, the micro structure layer being formed of a polymer of a resin composition that contains a silsesquioxane derivative as a major constituent having a plurality of polymerizable functional groups, another polymerizable resin component having a plurality of polymerizable functional groups and different from the silsesquioxane derivative, and a photopolymerizable initiator, in which a content percentage of the photopolymerizable initiator is equal to or more than 0.3 mass % and equal to or less than 3 mass % relative to a total mass of the silsesquioxane derivative and the polymerizable resin component, and the micro structure layer permits equal to or more than 80% of light to pass therethrough at a wavelength of 365 nm.

Also, the present invention that solves the problems provides a nano-imprinting resin stamper including a micro structure on a light-transmissive support basal material, the micro structure layer being formed of a polymer of a resin composition that contains a silsesquioxane derivative as a major constituent having a plurality of polymerizable functional groups, another polymerizable resin component having a plurality of polymerizable functional groups and different from the silsesquioxane derivative, and a thermalpolymerizable initiator, in which the content percentage of the thermalpolymerizable initiator is equal to or more than 0.5 mass % and less than 15 mass % relative to a total mass of the silsesquioxane derivative and the polymerizable resin component, and the micro structure layer permits equal to or more than 80% of light to pass therethrough at a wavelength of 365 nm.

Also, a nano-imprinting apparatus according to the present invention that solves the problems includes the nano-imprinting resin stamper, a fixing block that fixes the nano-imprinting resin stamper, a stage block that holds a transfer target, and a driving mechanism that drives at least either one of the fixing block and the stage block so that the nano-imprinting resin stamper is pressed against the transfer target and released from the transfer target thereafter.

DETAILED DESCRIPTION OF THE PREFERRED EMBODIMENTS

Next, a detailed explanation will be given of a nano-imprinting resin stamper and a nano-imprinting apparatus using the same according to an embodiment of the present invention with reference to the accompanying drawings. The explanation will be first given of a general configuration of the nano-imprinting apparatus, and then of the nano-imprinting resin stamper.

(Nano-Imprinting Apparatus)

Figure 1:
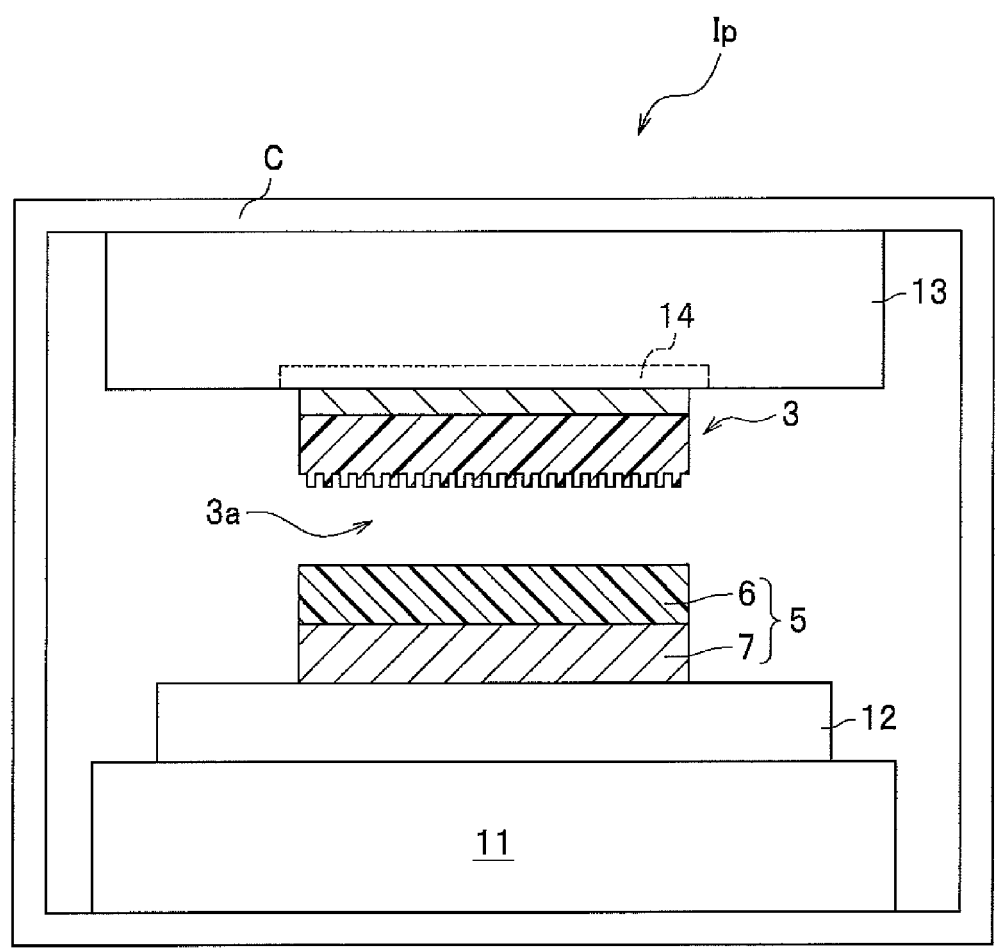
FIG. 1 is an explanatory diagram of a configuration of a nano-imprinting apparatus according to an embodiment of the present invention.

As shown in FIG. 1, a nano-imprinting apparatus Ip according to this embodiment includes a stage block 12 to which a transfer target 5 is attached and which is caused to ascend/descend by an ascending/descending device 11 within a vacuum chamber C as a casing, and a fixing block 13 to which a nano-imprinting resin stamper 3 (see FIG. 2) to be discussed later is attached. Note that the ascending/descending device 11 corresponds to a "driving mechanism" in the claims.

The ascending/descending device 11 according to this embodiment is supported to a bottom in the vacuum chamber C, and generates thrust force that is adjustable by an unillustrated electro-pneumatic regulator. Moreover, the ascending/descending device 11 inputs the generated thrust force into the stage block 12 through an unillustrated drive shaft, thereby ascending/descending the stage block 12.

The transfer target 5 includes a transfer target substrate 7 and a resin layer 6 arranged on a surface of the transfer target substrate 7 as a layer.

The transfer target substrate 7 is not limited to any particular one as long as it satisfies a required strength and process precision, and examples of such are a silicon wafer, various metals, glass, silica, ceramics, and plastics, etc.

The resin layer 6 formed of a photo-curable resin is expected in this embodiment.

Such transfer target 5 is held on the top surface of the stage block 12 so that the resin layer 6 faces the nano-imprinting resin stamper 3. In other words, as the stage block 12 is caused to ascend by the ascending/descending device 11, as will be described later, the resin layer 6 of the transfer target 5 is pressed against the nano-imprinting resin stamper 3.

The nano-imprinting resin stamper 3 is arranged above the stage block 12, and is attached to the ceiling part in the vacuum chamber C through the fixing block 13 in a replaceable manner. A micropattern 3a is formed in a surface of the nano-imprinting resin stamper 3 that faces the transfer target 5.

Note that a light source 14 that emits ultraviolet light is arranged in the fixing block 13, and the light source 14 is configured to emit ultraviolet light to the transfer target through the nano-imprinting resin stamper 3. Meanwhile, the nano-imprinting resin stamper 3 with a light transmissivity, in particular, ultraviolet light transmissivity is expected according to this embodiment.

(Nano-Imprinting Resin Stamper)

Figure 2:
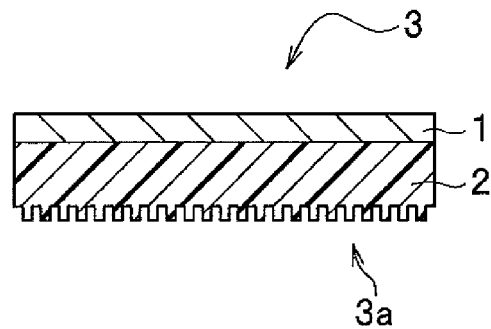
FIG. 2 is an explanatory diagram of a structure of a nano-imprinting resin stamper according to the embodiment of the present invention.

As shown in FIG. 2, the nano-imprinting resin stamper 3 according to this embodiment has a micro structure layer 2 on a support basal material 1. A micro structure means a structure that is formed in a size of from a nanometer to a micrometer order. More specifically, examples of such are a dot pattern having a plurality of minute protrusions arranged regularly, a pattern in contrary that has a plurality of micro concavities arranged regularly, and a lamella pattern (a line-and-space pattern) that has a plurality of lines arranged regularly. Such micropattern 3a is formed in the surface of the micro structure layer 2.

The support basal material 1 has shapes, materials, sizes, and a preparation method not limited to any particular ones as long as it has the function of holding the micro structure layer 2.

Example shapes of the supporting material 1 are circular, square and rectangular in a planar shape, and rectangular is preferable among those.

A material with a light transmissivity is used for the support basal material 1. In particular, a material that has a strength and processability like glass and silica is preferable. When the support basal material 1 is formed of such a material that has a high transparency, as will be discussed later, when the micro structure layer 2 is formed of a photo-curable resin, light will be emitted efficiently to the photo-curable resin. Moreover, when the support basal material 1 is formed of such a material that has a high transparency, even an unillustrated buffer layer formed of the photo-curable resin is formed between the support basal material 1 and the micro structure layer 2, light will be emitted effectively to the photo-curable resin that will be the buffer layer.

Furthermore, a coupling treatment may be performed on the surface of the support basal material 1 in order to enhance the adhesion force with the micro structure layer 2 and the above-described unillustrated buffer layer.

Moreover, the support basal material 1 can be configured by equal to or more than two kinds of layers with different elastic modulus. Such supporting material 1 has no specific restriction to a laminating order of the layers with a high elastic modulus and a low elastic modulus, a combination thereof, and the number of layers, etc. . . . .

For example, as the support basal material 1 having such equal to or more than two kinds of layers may be ones formed by selecting equal to or more than two kinds of materials described above in order to form respective layers, formed by combining a layer of the material described above and a layer of a resin, and formed by combining layers of formed of resin.

Specific examples of the above-described resin are a phenolic resin (PF), an urea resin (UF), a melamine resin (MF), polyethylene-terephthalate (PET), unsaturated polyester (UP), an alkyd resin, a vinyl-ester resin, an epoxy resin (EP), polyimide (PI), polyurethane (PUR), polycarbonate (PC), polystyrene (PS), an acrylate resin (PMMA), polyamide (PA), an ABS resin, an AS resin, an AAS resin, polyvinyl-alcohol, polyethylene (PE), polypropylene (PP), polytetrafluoroethylene (PTEF), polyallylate, cellulose acetate, polypropylene (PP), polyethylene-naphthalate (PEN), polybutylene-terephthalate (PBT), polyphenylene-sulfide (PPS), polyphenylene-oxide, cycloolefin polymer, polylactic acid, a silicone resin, and a diallyl-phthalate resin. It is possible that any one of those can be used in solo or a plurality of different resins may be combined.

It is desirable that the light transmissibility of such support base material 1 should allow light with a wavelength of 365 nm to pass through by equal to or larger than 90%.

The micro structure layer 2 is configured by a polymer of resin compositions that are a photo-curable or a heat-curable, and a micro structure in a size of from a nanometer to a micrometer order is formed in the surface thereof.

(Resin Composition)

The resin composition that forms the micro structure layer 2 contains a silsesquioxane derivative as a major constituent that has a plurality of polymerizable functional groups, and further contains a monomer constituent that has a plurality of polymerizable functional groups, and a photopolymerization initiator or a thermalpolymerization initiator. Meanwhile the resin composition that contains the photopolymerization initiator is photo-curable, and the resin composition that contains the thermalpolymerization initiator is heat-curable.

Note that the monomer constituent may also be referred to as a "another polymerizable resin component different from a silsesquioxane derivative".

<Silsesquioxane Derivative>

The silsesquioxane derivative is a generic name of network-like polysiloxane that is indicated by a composition formula of $RSiO_{1.5}$. The silsesquioxane derivative is known that it is structurally positioned in between inorganic silica (composition formula: $SiO_2$) and an organic silicone (composition formula: $R_2SiO$), and the characteristic thereof is also in between those.

Specific examples of such silsesquioxane derivative are ones that are indicated by following formulae (1) through (5). The formula (1) indicates the silsesquioxane derivative with a ladder structure, the formula (2) indicates the silsesquioxane derivative with a random structure, the formula (3) indicates the silsesquioxane derivative with a T8 structure, the formula (4) indicates the silsesquioxane derivative with a T10 structure, and the formula (5) indicates the silsesquioxane derivative with a T12 structure.

[Chemical Formula 1]

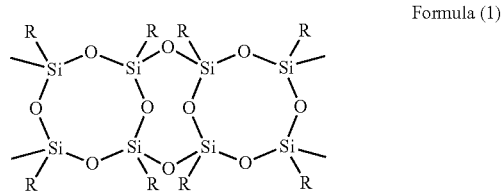

Formula (1)

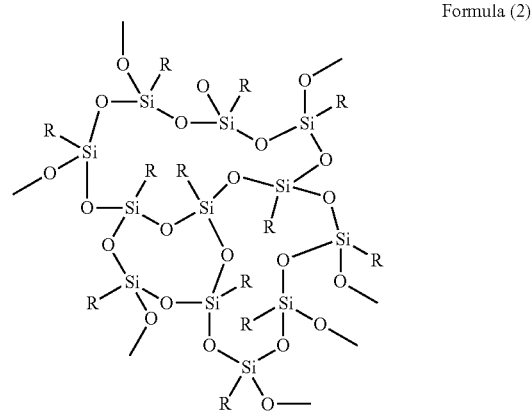

Formula (2)

[Chemical Formula 2]

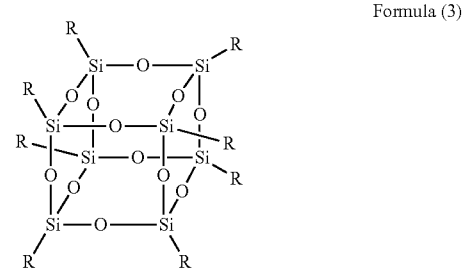

Formula (3)

Formula (4)

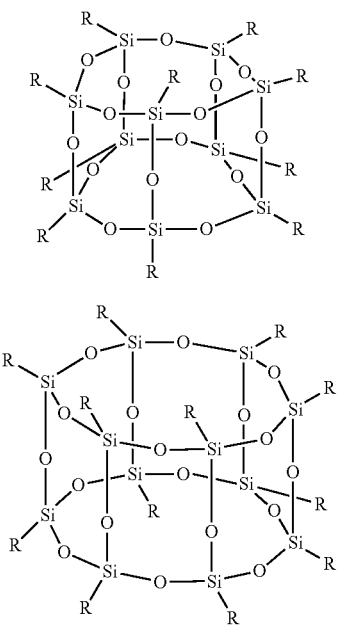

Formula (5)

However, in respective silsesquioxane derivatives indicated by the above-described formulae (1) through (5), R can be same or different from each other and each R represents a hydrogen atom or an organic group, and equal to or more than two R, desirably equal to or more than three R out of the plurality of R of each silsesquioxane derivative are polymerizable functional groups that are described later.

It is desired that the polymerizable functional group should be at least one kind selected from vinyl group, epoxy group, oxetanyl group, vinyl-ether group, and (meta) acrylic group.

It is desirable for such silsesquioxane derivative that a curing mechanism of the resin layer 6 (see FIG. 1) which is formed of the photopolymerization initiator selected in a transfer method using the nano-imprinting resin stamper 3 (see FIG. 2) according to the present invention to be discussed later and the curing mechanism of the silsesquioxane derivative be different from each other. More specifically, when a curable resin material for transferring is radically polymerizable, the silsesquioxane derivative of photo cation polymerizable is desirable, and when the curable resin material for transferring is, conversely, the photo cation polymerizable, the silsesquioxane derivative of photo radically polymerizable is desirable.

A commercially-available product can be used as the silsesquioxane derivative.

The above-described silsesquioxane derivative is a major constituent of the resin composition, and it is desirable that the content percentage should be equal to or more than 50%, desirably, equal to or more than 70%.

<Monomer Constituent>

Examples of a monomer constituent are ones including equal to or more than two polymerizable functional groups selected from a vinyl group, a (meta) acrylic group, an epoxy group, an oxetanyl group, and a vinyl ether group, and has no specific restriction to a skeleton, but the monomer constituent that is cured with the same mechanism as that of the polymerizable functional group of the above-described silsesquioxane derivative is desirable. Moreover, a monomer constituent that has a perfluoro skeleton (fluorine constituent) can be also used.

Examples of the monomer constituent that has an epoxy group are bisphenol-A-based epoxy resin monomer, hydrogenated bisphenol-A-based epoxy resin monomer, bisphenol-F-based epoxy resin monomer, novolak type epoxy resin monomer, aliphatic cyclic epoxy resin monomer, aliphatic normal-chain epoxy resin monomer, naphthalene type epoxy resin monomer, biphenyl type epoxy resin monomer, and bifunctional alcohol-ether type epoxy resin monomer.

Examples of the monomer constituent that has an oxetanyl group are 3-ethyl-3-{[3-ethyloxetane-3-yl]methoxymethyl}oxetane, 3-ethyl-3-hydroxymethyloxetane, 1,4-bis[(3-ethyl-3-oxetanylmethoxy)methyl]benzene, 3-ethyl-3-(phenoxymethyl)oxetane, di[1-ethyl(3-oxetanyl)]methyl-ether, 3-ethyl-3-(2-ethyl-hexyloxy-methyl)oxetane, 3-ethyl-3-{[3-(triethoxysiyl)propxy]methyl}oxetane, oxetanyl-silsesquioxane, and phenol-novolak-oxetane.

Examples of the monomer constituent that has an vinyl ether group are ethylene-glycol-divinyl-ether, diethylene-glycol-divinyl-ether, triethylene-glycol-divinyl-ether, tetraethylene-glycol-divinyl-ether, butanediol-divinyl-ether, hexanediol-divinyl-ether, cyclohexane-dimethanol-divinyl-ether, isophthalic-acid-di(4-vintloxy)butyl, glutaric-acid-di(4-vintloxy)butyl, succinic-acid-di(4-vintloxy)butyl-trimethylolpropane-trivinyl-ether, 2-hydroxyethyl-vinyl ether, hydroxybutyl-vinyl-ether, and hydroxy-hexyl-vinyl ether.

The examples of the organic constituent that have a functional group of any one of the epoxy group, the oxetanyl group, and the vinyl ether group are exemplified above, but the present invention is not limited to those constituents. When the polymerizable functional group, such as the vinyl group, the (meta) acrylic group, the epoxy group, the oxetanyl group, or the vinyl ether group is contained in a molecular chain, such a functional group can be basically used in the present invention. Moreover, although it is expected in this embodiment that the monomer constituent is a liquid at a room temperature, solid ones can also be used.

Note that a kind of or a combination of equal to or greater than two kinds of the monomer constituents are used in this embodiment.

The content percentage of such monomer constituent in the resin composition can be equal to or more than 1 mass % but less than 50 mass %.

<Photopolymerization Initiator>

The photopolymerization initiator is selected in accordance with the silsesquioxane derivative that is contained in the resin composition and the polymerizable functional group of the monomer constituent. Examples of the photopolymerization initiator are a photo radical polymerization initiator that generates radicals when irradiated with ultraviolet light, a photo anion polymerization initiator that generates anions when irradiated with ultraviolet light, and a photo cation polymerization initiator that generates cations when irradiated with ultraviolet light. The photo cation polymerization initiator is desirable among those since it can suppress a curing failure originating from oxygen inhibition.

The photo cation polymerization initiator is not limited to any particular one as long as it is an electrophile, has a cation generating source and cures an organic constituent by light, and the conventionally well-known photo cation polymerization initiator can be used. In particular, the photo cation polymerization initiator that starts curing by ultraviolet light is desirable since it enables formation of a concavo-convex pattern at a room temperature, and thus enabling formation of a replica from a master mold further highly precise.

Examples of the photo cation polymerization initiator are an iron-allene complex compound, aromatic diazonium salt, aromatic iodonium salt, aromatic sulfonium salt, pyridinium salt, aluminium complex/silyl ether, proton acid, and Lewis acid.

Specific examples of the photo cation polymerization initiator that starts curing by ultraviolet light are IRGACURE261 (made by Ciba-Geigy K.K.), ADEKA OPTOMER SP-150 (made by ADEKA Corporation), ADEKA OPTOMER SP-151 (made by ADEKA Corporation), ADEKA OPTOMER SP-152 (made by ADEKA Corporation), ADEKA OPTOMER SP-170 (made by ADEKA Corporation), ADEKA OPTOMER SP-171 (made by ADEKA Corporation), ADEKA OPTOMER SP-172 (made by ADEKA Corporation), ADEKA OPTOMER SP-300 (made by ADEKA Corporation), UVE-1014 (made by General Electric Company), CD-1012 (made by Sartomer), San-Aid SI-60L (made by SANSHIN CHEMICAL INDUSTRY Co., Ltd.), San-Aid SI-80L (made by SANSHIN CHEMICAL INDUSTRY Co., Ltd.), San-Aid SI-100L (made by SANSHIN CHEMICAL INDUSTRY Co., Ltd.), San-Aid SI-110 (made by SANSHIN CHEMICAL INDUSTRY Co., Ltd.), San-Aid SI-180 (made by SANSHIN CHEMICAL INDUSTRY Co., Ltd.), CI-2064 (made by NIPPON SODA Co., Ltd.), CI-2639 (made by NIPPON SODA Co., Ltd.), CI-2624 (made by NIPPON SODA Co., Ltd.), CI-2481 (made by NIPPON SODA Co., Ltd.), Uvacure 1590 (made by DAICEL-UCB Co., Ltd.), Uvacure 1591 (made by DAICEL-UCB Co., Ltd.), RHODORSILPhotoInItiator 2074 (made by Rhodia Corporation), UVI-6990 (made by Union Carbide Corporation), BBI-103 (made by MIDORI KAGAKU Co., Ltd.), MPI-103 (made by MIDORI KAGAKU Co., Ltd.), TPS-103 (made by MIDORI KAGAKU Co., Ltd.), MDS-103 (made by MIDORI KAGAKU Co., Ltd.), DTS-103 (made by MIDORI KAGAKU Co., Ltd.), DTS-103 (made by MIDORI KAGAKU Co., Ltd.), NAT-103 (made by MIDORI KAGAKU Co., Ltd.), NDS-103 (made by MIDORI KAGAKU Co., Ltd.), and CYRAURE UVI6990 (made by Union Carbide Japan).

One kind of such photopolymerization initiator can be used in solo or a combination of equal to or greater than two kinds thereof can also be used.

When the total mass of the above-described silsesquioxane derivative and the monomer constituent in the resin composition is 100, the content percentage of the photopolymerization initiator in the resin composition is set to be equal to or more than 0.3 mass % (equal to or more than 0.3 parts by mass) and equal to or less than 3 mass % (equal to or less than 3 parts by mass), and desirably, equal to or more than 1 mass % (equal to or more than 1 parts by mass) and equal to or less than 3 mass % (equal to or less than 3 parts by mass) in mass %.

By setting the content percentage of the photopolymerization initiator within such a range, a sufficient light transmissivity (transmissivity of equal to or greater than 80% for ultraviolet light at a wavelength of 365 nm) can be obtained, and the excellent transfer precision of the micropattern against the transfer target 5 (the resin layer 6) shown in FIG. 1 can be obtained, and, it becomes possible to form the micro structure layer 2 (see FIG. 2) that is excellent in repetitive transfer.

<Thermalpolymerization Initiator>

The thermalpolymerization initiator is selected in accordance with the silsesquioxane derivative that is contained in the resin composition and the polymerizable functional group of the monomer constituent. Examples of the thermalpolymerization initiator are a thermal radical polymerization initiator that generates radicals by heat, and a thermal cation polymerization initiator that generates cations by heat. The thermal cation polymerization initiator is desirable between those initiators since it can suppress a curing failure originating from oxygen inhibition. The thermal cation polymerization initiator is not limited to any particular one as long as it is an electrophile, has a cation generating source and cures an organic constituent by heat, and a conventionally well-known thermal cation polymerization initiator can be used.

Specific examples of the thermal cation polymerization initiator that starts curing by heat are San-Aid SI-60L (made by SANSHIN CHEMICAL INDUSTRY Co., Ltd.), San-Aid SI-80L (made by SANSHIN CHEMICAL INDUSTRY Co., Ltd.), San-Aid SI-100L (made by SANSHIN CHEMICAL INDUSTRY Co., Ltd.), San-Aid SI-110 (made by SANSHIN CHEMICAL INDUSTRY Co., Ltd.), San-Aid SI-180 (made by SANSHIN CHEMICAL INDUSTRY Co., Ltd.), ADEKA OPTOMER CP-66 (made by ADEKA Corporation), and ADEKA OPTOMER CP-77 (made by ADEKA Corporation). One kind of such thermalpolymerization initiator can be used in solo or a combination of equal to or greater than two kinds thereof can also be used. Moreover, it is possible to use the above-described photopolymerization initiator and thermalpolymerization initiator in combination therewith.

When the total mass of above-described silsesquioxane derivative and the monomer constituent in the resin composition is 100, the content percentage of the thermalpolymerization initiator in the resin composition is set to be equal to or more than 0.5 mass % (equal to or more than 0.5 parts by mass) and less than 15 mass % (less than 15 parts by mass), and desirably, equal to or more than 1 mass % (equal to or more than 1 parts by mass) and equal to or less than 10 mass % (equal to or less than 10 parts by mass), and more desirably, equal to or more than 1 mass % (equal to or more than 1 parts by mass) and equal to or less than 5 mass % (equal to or less than 5 parts by mass) in mass %.

By setting the content percentage of the thermalpolymerization initiator within such a range, the micro structure layer 2 can be formed which has a sufficient light transmissivity, an excellent transfer precision of micropattern to the transfer target 5 (the resin layer 6) shown in FIG. 1, and excellent in repetitive transfer.

It is desirable that such a resin composition should be a resin containing all constituents other than the photopolymerization initiator and the thermalpolymerization initiator having the polymerizable functional groups.

However, even if a solvent constituent without a reactive functional group that unintentionally mixed during a manufacturing process is contained in the resin composition, the effect of the present invention is not disturbed. Also, the resin composition may contain a surface active agent within a range that will not disturb the effect of the present invention in order to enhance the adhesiveness between the support basal material 1 (see FIG. 2) and the micro structure layer 2 (see FIG. 2). Furthermore, an additive agent like a polymerization inhibitor may be added as needed.

It is desirable that the support basal material 1 and the micro structure layer 2 in the nano-imprinting resin stamper 3 should be light-transmissive (ultraviolet light transmissivity at the wavelength of 365 nm). Such nano-imprinting resin stamper 3 enables the use of the photo-curable resin to a curable resin material 6 (see FIG. 3) of the transfer target to be described later. That is, the nano-imprinting resin stamper 3 can be used as a replica mold for optical nano-imprinting.

<Manufacturing Method of Nano-Imprinting Resin Stamper>

Figure 3A:
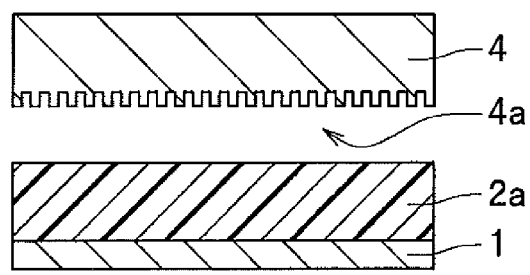
FIG. 3A is a process explanatory diagram exemplary showing a manufacturing method of the nano-imprinting resin stamper.
Figure 3B:
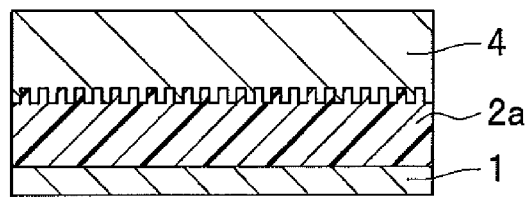
FIG. 3B is a process explanatory diagram exemplary showing the manufacturing method of the nano-imprinting resin stamper.
Figure 3C:
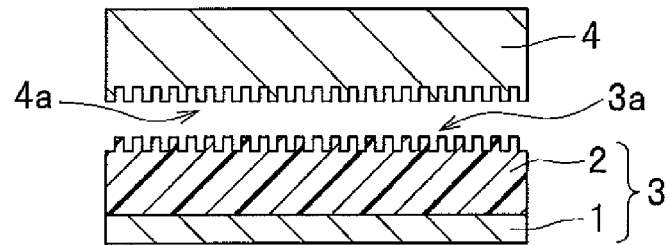
FIG. 3C is a process explanatory diagram exemplary showing the manufacturing method of the nano-imprinting resin stamper.

Next, an explanation will be given of a manufacturing method of the nano-imprinting resin stamper 3 (see FIG. 2) according to this embodiment. FIGS. 3A through 3C referred below are process explanatory diagrams exemplary showing the manufacturing method of the nano-imprinting resin stamper.

First, as shown in FIG. 3A, a master mold 4 formed with a micropattern 4a is prepared in this manufacturing method. At the same time, the above-described resin composition 2a is applied on the support basal material 1 for forming the micro structure layer 2.

Next, as shown in FIG. 3B, the master mold 4 is pressed against the applied resin composition 2a. Thereafter, the resin composition 2 is cured with the master mold 4 being pressed against the resin composition 2, and thus causing the micropattern 4a (see FIG. 3A) of the master mold 4 to be transferred to the resin composition 2a.

Note that the resin composition 2a can be cured by irradiating it with light if the resin composition 2a contains the above-described photopolymerization initiator, and by heating the resin composition 2a if it contains the thermalpolymerization initiator.

Next, as shown in FIG. 3C, the master mold 4 is demolded from the cured resin composition 2a (see FIG. 3B), and thus the nano-imprinting resin stamper 3 is obtained according to this embodiment and having the micro structure layer 2 formed on the support basal material 1. Note that the micropattern 3a formed on the micro structure layer 2 of the nano-imprinting resin stamper 3 is the inverted concavo-convex shape of the micropattern 4a of the master mold 4.

<Transfer Method of Micropattern Using Nano-Imprinting Apparatus>

Next, an explanation will be given of an operation of a nano-imprinting apparatus Ip (see FIG. 1), and of a transfer method of the micropattern 3a (see FIG. 1) using the nano-imprinting apparatus IP.

According to this transfer method, as shown in FIG. 1, the nano-imprinting resin stamper 3 (see FIG. 2) that is manufactured through the above-described processes (see FIGS. 3A through 3C) is attached to the fixing block 13. At this time, the nano-imprinting resin stamper 3 is attached so that the micropattern 3a thereof faces the stage block 12.

Also, the transfer target 5 is attached to the stage block 12 opposite to the nano-imprinting resin stamper 3. At this time, the transfer target 5 is attached so that the resin layer 6 faces the micropattern 3a of the nano-imprinting resin stamper 3.

Next, according to this transfer method, by ascending the stage block 12 on the ascending/descending device 11 shown in FIG. 1, the resin layer 6 of the transfer target 5 is pressed against the micropattern 3a of the nano-imprinting resin stamper 3. Consequently, it is not illustrated but the shape of the micropattern 3 is transferred to the resin layer 6.

Thereafter, with the nano-imprinting resin stamper 3 being pressed against the resin layer 6, the light source 14 emits ultraviolet light to the resin layer 6. This causes the resin layer 6 to which the micropattern 3A is transferred to be cured.

Thereafter, by descending the stage block 12 on the ascending/descending device 11, the nano-imprinting resin stamper 3 is released from the transfer target 5.

Figure 4:
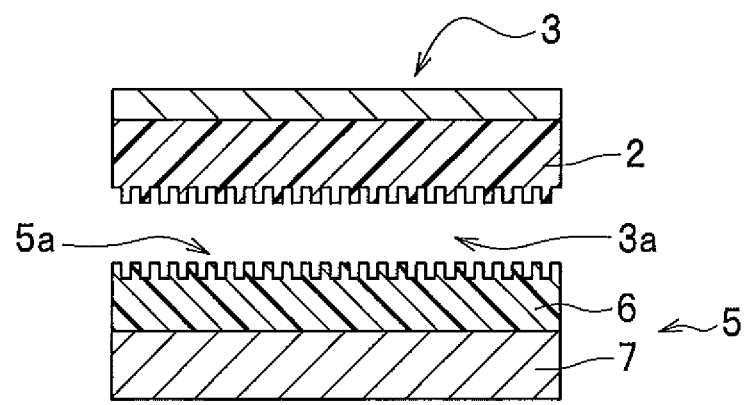
FIG. 4 is an explanatory diagram of a structure of a nano-imprinting resin stamper according to another embodiment of the present invention.

Next, FIG. 4 to be referred is an exemplary diagram showing how the nano-imprinting resin stamper is pressed against the transfer target and released again therefrom.

As shown in FIG. 4, this transfer method completes by releasing the nano-imprinting resin stamper 3 from the cured resin layer 6. That is, a micropattern 5a is formed on the cured resin layer 6 of the transfer target 5.

Note that the micropattern 5a that is transferred to the transfer target 5 is an inverted concavo-convex shape of the micropattern 3a that is formed on the micro structure layer 2 of the nano-imprinting resin stamper 3. That is, the micropattern 5a is in a shape that corresponds to the concavo-convex shape of the micropattern 4a (see FIG. 3A) of the master mold 4.

The above-explained nano-imprinting resin stamper 3 according to this embodiment is the resin composition that contains the silsesquioxane derivative and the monomer constituent as a major constituent, and contains equal to or more than 0.3 mass % and equal to or less than 3 mass % of the photopolymerization initiator relative to the total mass of the silsesquioxane derivative and the monomer constituent, or contains equal to or more than 0.5 mass % and less than 15 mass % of the thermalpolymerization initiator relative to that total mass. Hence, the nano-imprinting resin stamper 3 has, on the support basal material 1, the micro structure layer 2 that has a sufficient light transmissivity which causes equal to or greater than 80% of light to pass therethrough at a wavelength of 365 nm.

Hence, according to the nano-imprinting resin stamper 3 of this embodiment, it is possible to reduce an absorption amount of ultraviolet light when the transfer target 5 (see FIG. 1) is irradiated with ultraviolet light from the light source 14 (see FIG. 1) thorough the nano-imprinting resin stamper 3.

Consequently, the resin layer 6 of the transfer target 5 is irradiated with ultraviolet light efficiently, and thus a curing time of the resin layer 6 can be reduced. As a result, it is possible to maintain a good throughput when the transfer target is obtained.

Also, according to the nano-imprinting resin stamper 3 of this embodiment, since it is possible to reduce the absorption amount of ultraviolet light by the micro structure layer 2, a thermal expansion of the micro structure layer 2 is suppressed. Consequently, the nano-imprinting resin stamper 3 has an excellent transfer precision of the micropattern 3a (see FIG. 1) to the transfer target 5.

Also, according to the nano-imprinting resin stamper 3 of this embodiment, since the micro structure layer 2 is formed of a resin composition polymer containing the silsesquioxane derivative as a major constituent, unlike the conventional stamper, the nano-imprinting resin stamper 3 has an excellent following capability to warpages and bumps of the transfer target substrate 7, and has an excellent demolding characteristic to the transfer target 5 (see FIG. 1) without a demolding agent being applied on a surface.

Consequently, unlike the conventional stamper, the nano-imprinting resin stamper 3 has a further excellent transfer precision of the micropattern 3a (see FIG. 1) since no application unevenness of the demolding agent is formed on the surface of the nano-imprinting resin stamper 3 together with accomplishment of the good following capability of the transfer target substrate 7.

Also, unlike the conventional stamper, since it is unnecessary to apply the demolding agent on a surface of the nano-imprinting resin stamper 3, a demolding layer is not deteriorated by repetitive transfer. Consequently, the nano-imprinting resin stamper 3 has excellent so-called repetitive transfer characteristic.

Also, such nano-imprinting resin stamper 3 that can improve the repetitive transfer characteristic without needing the demolding agent can reduce a running cost of the manufacturing of the transfer target by the nano-imprinting apparatus Ip (see FIG. 1).

The explanation was given of the embodiment of the present invention, but the present invention is not limited to this embodiment, and can be changed and modified in various forms.

Figure 5:
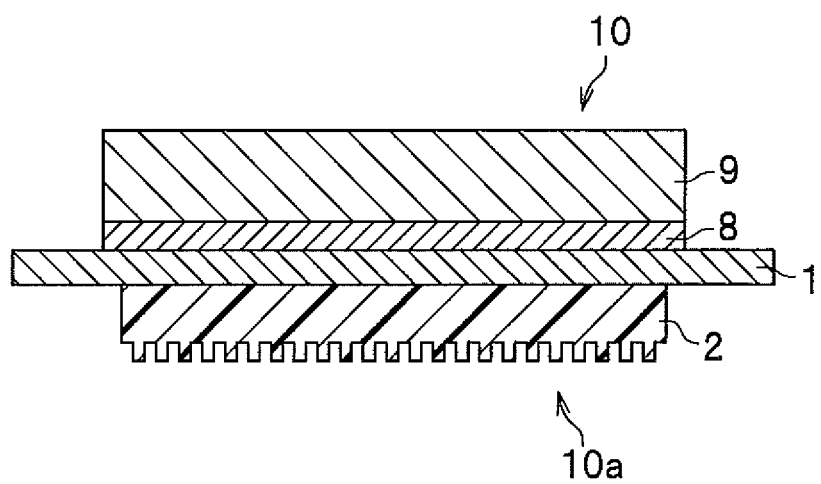
FIG. 5 is an exemplary diagram showing a nano-imprinting resin stamper according to the other embodiment of the present invention.

According to above-described embodiment, as shown in FIG. 2, the explanation was given of the nano-imprinting resin stamper 3 having the micro structure layer 2 formed on the support basal material 1. However, it is possible to further arrange another substrate on a surface opposite to the micro structure layer 2 on the support basal material 1. FIG. 5 to be referred next is an exemplary diagram showing a nano-imprinting resin stamper according to another embodiment of the present invention.

As shown in FIG. 5, a nano-imprinting resin stamper 10 includes a light-transmissive elastic body plate 8 and a light-transmissive hard substrate 9 in this order on a surface opposite to the light-transmissive and flexible support basal material 1 that is provided with the micro structure layer 2.

Note that a reference numeral 10a in FIG. 5 is a micropattern of the micro structure layer 2.

The elastic body plate 8 is formed of a light-transmissive rubber member. A specific example of the rubber member is a synthetic rubber like a transparent silicone rubber. It is preferable that a thickness of the elastic body plate 8 should be in a range from 3 mm to 15 mm.

Examples of the light-transmissive hard substrate 9 are a glass plate, a silica plate, and a plastic plate that are transparent. Examples of the plastic plate are an acrylate resin plate and a hard vinyl chloride plate. It is preferable that a thickness of the hard substrate 9 should be in a range from 10 mm to 30 mm.

The support basal material 1, the elastic body plate 8, and the hard substrate 9 are bonded one another using an adhesive. Light-transmissive adhesives, such as an acrylic-rubber-based photo adhesive and an UV curing type polyester resin adhesive can be used as the adhesive.

The elastic body plate 8 and the hard substrate 9 can be mechanically bonded together using a jig (e.g., a ring) and a fastener (e.g., a bolt) prepared separately. Also, a vacuum port may be formed in the hard substrate 9, and the elastic body plate 8 can be suctioned through the vacuum port using a suction pump. Note that the adsorption and the above-described mechanical bonding can be used together.

According to the nano-imprinting resin stamper 10 as shown in FIG. 5, when a micropattern 10a is transferred by pressing the nano-imprinting resin stamper 10 against the transfer target 5 (see FIG. 1), because of the elasticity produced by the elastic body plate 8, the micro structure layer 2 presses the resin layer 6 (see FIG. 1) of the transfer target 5 (see FIG. 1) with a uniform force, so that it becomes possible to transfer the micropattern 10a to the resin layer 6 precisely. Also, since the micro structure layer 2 presses the resin layer 6 (see FIG. 1) with the uniform force, it is possible to further surely prevent air from being trapped in between the micro structure layer 2 and the resin layer 6.

Meanwhile, as described above, by setting the thickness of the elastic body plate 8 to be equal to or more than 3 mm, it becomes possible to deform the support basal material 1 and the micro structure layer 2 as needed sufficiently, so that the transfer precision of the micropattern is further improved. Also, by setting the thickness of the elastic body plate 8 to be equal to or less than 15 mm, when the nano-imprinting resin stamper 10 is used for transferring, a deformation of the plane direction of the elastic plate is suppressed, and thus misalignment of the support basal material 1 in the horizontal direction can be further surely suppressed. This results in further improvement of the transfer precision of the micropattern 10a.

Also, according to the nano-imprinting resin stamper 10, a mechanical strength of the nano-imprinting resin stamper 10 can be further improved because of a rigidity of the hard substrate 9.

Meanwhile, as described above, by setting the thickness of the hard substrate 9 to be equal to or more than 10 mm, it becomes possible to give a sufficient mechanical strength to the nano-imprinting resin stamper 10. Also, by setting the thickness of the hard substrate 9 to be equal to or less than 30 mm, it becomes possible to maintain a good light transmissivity of the hard substrate 9.

Also, according to the above-described embodiment, it is expected that the micro structure layer 2 (see FIG. 2) is formed with a size consistent with the area of a top surface of the support basal material 1 (see FIG. 2). According to the present invention, however, the micro structure layer 2 can be formed with a size smaller than the area of the top surface of the support basal material 1 (see FIG. 2). Also, at this time, it is possible to form the micro structure layer 2 so that a planar shape thereof is different from the shape of the top surface of the support basal material 1, and is in various shapes, such as circular, elliptical, and polygonal shapes. Also, the micro structure layer 2 may be formed at the center of the top surface of the support basal material 1 or may be formed at a displaced position from the center of the top surface of the support basal material 1.

Also, according to the nano-imprinting apparatus Ip (see FIG. 1) of the above-described embodiment, a configuration is employed in which the nano-imprinting resin stamper 3 and the transfer target 5 are contacted with each other by driving the stage block 12 with the ascending/descending device 11. However, the present invention may be configured so that the nano-imprinting resin stamper 3 and the transfer target 5 are contacted with each other by driving the fixing block 13 with a predetermined driving mechanism.

EXAMPLES

Next, a more specific explanation will be given of the present invention with examples. Terms "part" and "%" used in the following explanation are all in mass standard unless indicated.

First Example

In this example, the nano-imprinting resin stamper 3 was manufactured through processes that shown in FIGS. 3A through 3C.

<Preparation of Resin Composition>

First, as shown in table 1 below, 90 parts by mass of silsesquioxane derivative OX-SQ SI-20 (made by TOA GOSEI CO., LTD.) having a plurality of oxetanyl groups, 10 parts by mass of 1,4-bis(2,3-epoxypropyl)perfluorobutane (made by DAIKIN INDUSTRIES, LTD) that was diepoxy having a perfluoro skeleton as a photo polymerizable monomer (a monomer constituent), and ADEKA OPTOMER SP-172 (made by ADEKA Corporation) as a photo cation polymerization initiator were mixed at 0.3 mass % (0.3 parts by mass) relative to the total 100 parts by mass of the silsesquioxane derivative and the monomer constituent, and a photo-curable resin composition 2a (see FIG. 3A) was obtained in order to form the micro structure layer 2 (see FIG. 3C).

TABLE 1

|  | First Example | Second Example | Third Example | Fourth Example | Fifth Example | Sixth Example | Seventh Example |
|---|---|---|---|---|---|---|---|
| Silsesquioxane derivative [parts by mass] (OXSQ SI-20) | 90 | ← | ← | ← | ← | ← | ← |
| Photopolymerization monomer (BEPP) [parts by mass] | 10 | ← | ← | ← | ← | ← | ← |
| Photopolymerization initiator (SP172) [mass %] | 0.3 | 0.6 | 3 | — | — | — | 3 |
| Photopolymerization initiator (SP152) [mass %] | — | — | — | 0.6 | — | — | — |
| Photopolymerization initiator (SP300) [mass %] | — | — | — | — | 0.6 | 3 | — |
| Thermalpolymerization initiator (San-Aid SI60) [mass %] | — | — | — | — | — | — | — |
| Stamper structure | 2 layers | ← | ← | ← | ← | ← | 3 layers |
| Elastic modulus of micro structure layer [Gpa] | 0.7 | 0.8 | 1.0 | 0.4 | 0.5 | 0.7 | 1.0 |
| Light transmissivity of micro structure layer [%] (wavelength: 365 nm thickness: 30 μm) | 90.0 | 89.6 | 80.1 | 89.3 | 88.2 | 81.5 | 80.1 |
| Maximum dimension change rate [%] | 6.4 | 3.4 | 2.0 | 8.9 | 6.1 | 4.3 | 2.0 |
| Availability of transmissivity (transmissivity of equal to or greater than 80%) | ○ | ○ | ○ | ○ | ○ | ○ | ○ |
| Possibility of five-time repetitive transfer (change rate of equal to or less than 10%) | ○ | ○ | ○ | ○ | ○ | ○ | ○ |

<Preparation of Nano-Imprinting Resin Stamper>

Next, as a support basal material 1 (see FIG. 3A), a glass plate having a size of 20 mm by 20 mm and a thickness of 0.7 mm and having a surface subjected to a silane coupling treatment by KBM403 (made by Shin-Etsu Chemical Co., Ltd.) was prepared.

Meanwhile, according to the glass plate having undergone a silane coupling treatment, a transmissivity of ultraviolet light at a wavelength of 365 nm was 97%.

On the surface of the support basal material 1 having undergone the coupling treatment, a resin composition 2a to be a micro structure layer 2 was applied (see FIG. 3A). Next, a silicon (Si) made master mold 4a having a surface subjected to a demolding treatment by OPTOOL DSX (made by DAIKIN INDUSTRIES, LTD) was prepared (see FIG. 3A). A micropattern 4a (see FIG. 3A) that was formed on the master mold 4 was a dot pattern having cylindrical minute protrusions (diameter: 180 nm, and height: 200 nm) arranged side by side hexagonally at a pitch of 180 nm.

Next, as shown in FIG. 3B, the resin composition 2a was cured with the master mold 4 being pressed against the resin composition 2a and being irradiated with ultraviolet light at a wavelength of 365 nm for 600 seconds. Thereafter, the master mold 4 was release from the cured resin composition 2a (see FIG. 3B), and as shown in FIG. 3C, the nano-imprinting resin stamper 3 (a soft stamper) of the present invention having the micro structure layer 2 formed on the support basal material 1 was prepared. This nano-imprinting resin stamper 3 had a two-layer structure (in table 1, indicated as the stamper structure) of the support basal material 1 and the micro structure layer 2.

Meanwhile, the micropattern 3a (see FIG. 2) of the micro structure layer 2 was a pattern having minute cylindrical concave shapes (diameter: 180 nm, and depth: 200 nm) arranged side by side which was a reversed (inverted) concavo-convex of the dot pattern of the master mold 4.

Next, the prepared nano-imprinting resin stamper 3 and the transfer target 5 were attached to the nano-imprinting apparatus Ip as shown in FIG. 1.

As the transfer target 5, one that had the resin layer 6 (see FIG. 1) formed of a resin composition of a photo radical polymerization containing an acrylate monomer as a major constituent on the transfer target substrate 7 formed of a glass plate was used.

Next, the resin layer 6 was let to be cured with the micropattern 3a of the nano-imprinting resin stamper 3 being pressed against the resin layer 6 of the transfer target 5, and with the transfer target 5 being irradiated with ultraviolet light from the light source 14 (see FIG. 1).

Thereafter, the nano-imprinting resin stamper 3 was released from the cured resin layer 6, and the transfer target 5 was obtained having a micropattern 5a (see FIG. 4) formed on the surface of the cured resin layer 6.

The micropattern 5a corresponded to the micropattern 4a of the master mold 4 with a good transfer precision, and a dot pattern having cylindrical minute protrusions (diameter: 180 nm, and height: 200 nm) arranged side by side hexagonally at a pitch of 180 nm was confirmed in the resin layer 6.

Next, in the prepared nano-imprinting resin stamper 3, an elastic modulus [GPa] of the micro structure layer 2, a light transmissivity [%], and a maximum dimension change rate [%] of the micropattern 5a formed on the transfer target 5 to be described later were measured. The results are shown in table 1.

Note that the elastic modulus was measured through a common procedure from the micro structure layer 2 at 30° C.

Regarding the light transmissivity, a light transmissivity of ultraviolet light at a wavelength of 365 nm was measured from a cured film formed of the above-described resin structure layer 2 with a thickness of 30 μm that was used when the nano-imprinting resin stamper 3 was prepared.

Note that regarding the light transmissivity [%], it was determined that the light transmissivity was good when it was equal to or greater than 80%, which is indicated by circular mark in the field of the availability of transmissivity in table 1. Also, a light transmissivity less than 80% was determined as a defect which is indicated by a cross mark in the field of the availability of transmissivity in table 1.

As the maximum dimension change rate [%], when the nano-imprinting resin stamper 3 was used for repetitive transfer to the above-described plurality of transfer targets 5, a maximum dimension change rate [%] of the micropattern 5a at the first transfer and at the fifth transfer were measured. More specifically, the height of the minute protrusion of the micropattern 5a at the first transfer and the height of the minute protrusion thereof at the fifth transfer were measured through an atomic force microscope (made by Veeco Instruments Inc.) and the change rate [%] was calculated.

The change rate [%] was obtained for five points on the transfer target 5 and the maximum value among those five change rates [%] was taken as the maximum dimension change rate [%].

Note that the maximum dimension change rate [%] was determined as good when it was equal to or less than 10%, which is indicated by a circular mark in the field of the possibility of five-time repetitive transfer of table 1. Also, the maximum dimension change rate exceeding 10% was determined as a defect which is indicated by a cross mark in the field of the possibility of five-time repetitive transfer of table 1.

Second Example to Sixth Example

In these examples, the nano-imprinting resin stamper 3 having the micro structure layer 2 formed through the same method as that of the first example was prepared except that the resin composition containing the photopolymerization initiator at a content percentage shown in table 1 was used.

Note that, in table 1, the photopolymerization initiator (SP152) was ADEKA OPTOMER SP-152 (made by ADEKA Corporation) as the photo cation polymerization initiator, the photopolymerization initiator (SP 300) was ADEKA OPTOMER SP-300 (made by ADEKA Corporation) as the photo cation polymerization initiator, and the thermalpolymerization initiator (San-Aid SI60) was the San-Aid SI-60 (made by SANSHIN CHEMICAL INDUSTRY Co., Ltd.) as the thermal cation polymerization initiator. Notations of these polymerization initiators are same throughout table 2 to table 4 to be described later.

The transfer target 5 having the micropattern 5a (see FIG. 4) formed through the same fashion as the first example was obtained except that the above-explained nano-imprinting resin stamper 3 was used.

As a result, it was confirmed that the micropattern 5a corresponded to the micropattern 4a of the master mold 4 with a good transfer precision.

Also, in the prepared nano-imprinting resin stamper 3, the elastic modulus [GPa] of the micro structure layer 2, the light transmissivity [%], and the maximum dimension change rate [%] of the micropattern 5a formed on the transfer target 5 were measured through the same method as that of the first example, and the availability of transmissivity and the possibility of five-time repetitive transfer were measured like the first example. The results are shown in table 1.

Seventh Example

In this example, a resin composition which was same as the third example was prepared.

A nano-imprinting resin stamper was prepared through following unillustrated procedures.

As the master mold 4, one having undergone a demolding treatment like the first example other than the micropattern 4a that was a line-and-space pattern (pitch: 90 nm, and height of wall: 50 nm) was used.

Next, a resin composition was applied through spin coating on a surface of the master mold 4 where the micropattern 4a was formed and cured by being irradiated with ultraviolet light at a wavelength of 365 nm for 600 seconds.

Next, after a photo-curable epoxy resin was applied on the surface of the cured resin composition layer through spin coating, the epoxy resin was cured with a highly elastic support basal material with a light transmissivity being pressed against the surface of the cured epoxy resin. Note that a coupling treatment was applied on the surface of the support basal material contacting the epoxy resin by KBM403 (made by Shin-Etsu Chemical Co., Ltd.).

Next, by releasing the master mold 4, the nano-imprinting resin stamper of a three-layer structure (in table 1, indicated as stamper structure) having the micro structure layer of the cured resin composition of the third example, a supporting layer of the cured epoxy resin, and the highly elastic support basal material (20 mm by 20 mm, and thickness: 0.7 mm) laminated in this order was prepared.

Thereafter, the transfer target 5 having the micropattern 5a (see FIG. 4) formed through the same fashion as the first example was obtained except that the above-explained nano-imprinting resin stamper was used.

Consequently, it was confirmed that the micropattern 5a corresponded to the micropattern 4a of the master mold 4 with a good transfer precision.

Also, in the prepared nano-imprinting resin stamper, an elastic modulus [GPa] of the micro structure layer, a light transmissivity [%], and a maximum dimension change rate [%] of the micropattern 5a formed on the transfer target 5 were measured through the same method as that of the first example, and the availability of transmissivity and the possibility of five-time repetitive transfer were measured like the first example. The results are shown in table 1.

Eighth Example

In this example, a resin composition (see table 1) which was same as the third example was prepared.

A nano-imprinting resin stamper was prepared through following unillustrated procedures.

First, a master mold 4 same as that of the seventh example having undergone a demolding treatment was prepared.

Next, a resin composition was applied through spin coating on a surface of the master mold 4 where the micropattern 4a was formed and cured by being irradiated with ultraviolet light at a wavelength of 365 nm for 600 seconds.

Next, after a photo-curable unsaturated polyester was applied through spin coating on the surface of the cured resin composition layer, it was irradiated with ultraviolet light and cured in order to form the first supporting layer.

Next, after a photo-curable epoxy resin was applied through spin coating on the surface of the first supporting layer, the epoxy resin was cured with a highly elastic support basal material with a light transmissivity being pressed against the epoxy resin, and thus a second supporting layer was formed between the first supporting layer and the supporting basal material. Note that a coupling treatment was applied on the surface of the support basal material contacting the epoxy resin by KBM403 (made by Shin-Etsu Chemical Co., Ltd.).

Also, by releasing the master mold 4, the nano-imprinting resin stamper of a four-layer structure (in table 2, indicated as stamper structure) having the micro structure layer of the cured resin composition of the third example, the first supporting layer of the cured unsaturated polyester, the second supporting layer of the cured epoxy resin, and the highly elastic support basal material (20 mm by 20 mm, and thickness: 0.7 mm) laminated in this order was prepared.

Note that the first supporting layer of the nano-imprinting resin stamper had lower elasticity than that of the micro structure layer. The second supporting layer had lower elasticity than that of the first supporting layer, and the support basal material made of glass had higher elasticity than that of the second supporting layer.

TABLE 2

|  | Eighth Example | Ninth Example | Tenth Example | Eleventh Example | Twelfth Example | Thirteenth Example | Fourteenth Example | Fifteenth Example |
|---|---|---|---|---|---|---|---|---|
| Silsesquioxane derivative [parts by mass] (OXSQ SI-20) | 90 | ← | 100 | ← | 90 | ← | ← | ← |
| Photopolymerization monomer (BEPP) [parts by mass] | 10 | ← | — | — | 10 | ← | ← | ← |
| Photopolymerization initiator (SP172) [mass %] | 3 | 3 | 0.3 | 3 | — | — | — | — |
| Photopolymerization initiator (SP152) [mass %] | — | — | — | — | — | — | — | — |
| Photopolymerization initiator (SP300) [mass %] | — | — | — | — | — | — | — | — |
| Thermalpolymerization initiator (San-Aid SI60) [mass %] | — | — | — | — | 0.5 | 1 | 5 | 10 |
| Stamper structure | 4 layers | 4 layers | 2 layers | ← | ← | ← | ← | ← |
| Elastic modulus of micro structure layer [Gpa] | 1.0 | 1.0 | 0.4 | 0.6 | 0.6 | 1.0 | 1.0 | 0.7 |
| Light transmissivity of micro structure layer [%] (wavelength: 365 nm thickness: 30 μm) | 80.1 | 80.1 | 89.3 | 92.1 | 88.3 | 87.6 | 86.9 | 85.8 |
| Maximum dimension change rate [%] | 2.0 | 2.0 | 9.3 | 7.3 | 8.8 | 3.1 | 2.9 | 5.9 |
| Availability of transmissivity (transmissivity of equal to or greater than 80%) | ○ | ○ | ○ | ○ | ○ | ○ | ○ | ○ |
| Possibility of five-time repetitive transfer (change rate of equal to or less than 10%) | ○ | ○ | ○ | ○ | ○ | ○ | ○ | ○ |

Next, the transfer target 5 having the micropattern 5a (see FIG. 4) formed through the same fashion as the first example was obtained except that the above-explained nano-imprinting resin stamper was used.

Consequently, it was confirmed that the micropattern 5a corresponded to the micropattern 4a of the master mold 4 with a good transfer precision.

Also, in the prepared nano-imprinting resin stamper, an elastic modulus [GPa] of the micro structure layer, a light transmissivity [%], and a maximum dimension change rate [%] of the micropattern 5a formed on the transfer target 5 were measured through the same method as the first example, and the availability of transmissivity and the possibility of five-time repetitive transfer were measured like the first example. The results are shown in table 2.

Ninth Example

In this example, a resin composition (see table 1) which was same as the third example was prepared, and by using this resin composition, a nano-imprinting resin stamper 10 shown in FIG. 5 was prepared.

First, as a support basal material 1, a glass plate like the first example having undergone a silane coupling treatment was prepared.

The resin composition was applied on the surface of the support basal material 1 having undergone the coupling treatment.

Next, a master mold 4 (see FIG. 3A) like the seventh example having undergone a demolding treatment was prepared, and on the surface of the master mold 4 where a micropattern 4a (see FIG. 3A) was formed, the support basal material 1 was arranged so that the resin composition was pressed against such a surface. Thereafter, the above-explained resin composition was cured by being irradiated with ultraviolet light at a wavelength of 365 nm through the support basal material 1 for 600 seconds. Next, by releasing the master mold 4 from the resin composition, the micro structure layer 2 having a micropattern 10a shown in FIG. 5 was formed on the support basal material 1.

Next, as shown in FIG. 5, the nano-imprinting resin stamper 10 was prepared by laminating a light-transmissive elastic body plate 8 and a light-transmissive hard substrate 9 by an adhesive in this order on a surface opposite to the surface of support basal material 1 where the micro structure layer 2 was formed.

Note that a silicone rubber (made by Dow Corning Toray Co., Ltd., SYLGARD (Registered Trademark), and thickness: 10 mm) was used as the elastic plate 8, and a silica substrate (thickness: 0.7 mm) was used as the hard substrate 9.

Thereafter, the transfer target 5 having the micropattern 5a (see FIG. 4) formed through the same fashion as the first example was obtained except that the above-explained nano-imprinting resin stamper 10 (see FIG. 5) was used.

Consequently, it was confirmed that the above-explained micropattern 5a corresponded to the micropattern 4a of the master mold 4 with a good transfer precision.

Also, in the prepared nano-imprinting resin stamper, an elastic modulus [GPa] of the micro structure layer, a light transmissivity [%], and a maximum dimension change rate [%] of the micropattern 5a formed on the transfer target 5 were measured through the same method as the first example, and the availability of transmissivity and the possibility of five-time repetitive transfer were measured like the first example. The results are shown in table 2.

Tenth Example to Fifteenth Example

In these examples, the nano-imprinting resin stamper 3 (see FIG. 2) having the micro structure layer 2 formed through the same method as that of the first example was prepared except that a resin composition containing the photopolymerization initiator shown in table 2 at a content percentage shown in table 2 was used.

Thereafter, the transfer target 5 having the micropattern 5a (see FIG. 4) formed through the same fashion as the first example was obtained except that the above-explained nano-imprinting resin stamper 3 was used.

Consequently, it was confirmed that the above-explained micropattern 5a corresponded to the micropattern 4a of the master mold 4 with a good transfer precision.

Also, in the prepared nano-imprinting resin stamper 3, an elastic modulus [GPa] of the micro structure layer 2, a light transmissivity [%], and a maximum dimension change rate [%] of the micropattern 5a formed on the transfer target 5 were measured through the same method as the first example, and the availability of transmissivity and the possibility of five-time repetitive transfer were measured like the first example. The results are shown in table 2.

First, Second, Fourth, Sixth, and Twelfth Comparative Example

In the first, second, fourth, sixth, and twelfth comparative examples, the nano-imprinting resin stamper 3 having the micro structure layer 2 formed through the same method as that of the first example was prepared except that a resin composition containing the photopolymerization initiator shown in table 3 and table 4 at a content percentage shown in table 3 and table 4 was used.

Thereafter, the transfer target 5 having the micropattern 5a (see FIG. 4) formed through the same fashion as the first example was obtained except that the above-explained nano-imprinting resin stamper 3 was used.

Also, in the prepared nano-imprinting resin stamper 3, an elastic modulus [GPa] of the micro structure layer 2, a light transmissivity [%], and a maximum dimension change rate [%] of the micropattern 5a formed on the transfer target 5 were measured through the same method as the first example, and the availability of transmissivity and the possibility of five-time repetitive transfer were measured like the first example. The results are shown in table 3 and table 4.

Third, Fifth, and Seventh Comparative Example

In the third, fifth, and seventh comparative example, a resin composition containing the photopolymerization initiator shown in table 3 and table 4 at a content percentage shown in table 3 and table 4 was used.

TABLE 3

|  | First Comparative Example | Second Comparative Example | Third Comparative Example | Fourth Comparative Example | Fifth Comparative Example | Sixth Comparative Example |
|---|---|---|---|---|---|---|
| Silsesquioxane derivative [parts by mass] (OXSQ SI-20) | 90 | ← | ← | ← | ← | ← |
| Photopolymerization monomer (BEPP) [parts by mass] | 10 | ← | ← | ← | ← | ← |
| Photopolymerization initiator (SP172) [mass %] | 6 | 0.12 | 0.06 | — | — | — |
| Photopolymerization initiator (SP152) [mass %] | — | — | — | 6 | 0.3 | — |
| Photopolymerization initiator (SP300) [mass %] | — | — | — | — | — | 6 |
| Thermalpolymerization initiator (San-Aid SI60) [mass %] | — | — | — | — | — | — |
| Stamper structure | 2 layers | ← | ← | ← | ← | ← |
| Elastic modulus of micro structure layer [Gpa] | 1.1 | 0.4 | 0.3 | 0.8 | 0.2 | 0.5 |
| Light transmissivity of micro structure layer [%] (wavelength: 365 nm thickness: 30 μm) | 76.3 | 92.6 | 92.9 | 60.9 | 90.0 | 75.5 |
| Maximum dimension change rate [%] | 1.5 | 25.6 | N/A | 2.0 | N/A | 2.0 |
| Availability of transmissivity (transmissivity of equal to or greater than 80%) | x | ○ | ○ | x | ○ | x |
| Possibility of five-time repetitive transfer (change rate of equal to or less than 10%) | ○ | x | x | ○ | x | ○ |

TABLE 4

|  | Seventh Comparative Example | Eighth Comparative Example | Ninth Comparative Example | Tenth Comparative Example | Eleventh Comparative Example | Twelfth Comparative Example |
|---|---|---|---|---|---|---|
| Silsesquioxane derivative [parts by mass] (OXSQ SI-20) | 90 | ← | ← | 100 | ← | 90 |
| Photopolymerization monomer (BEPP) [parts by mass] | 10 | ← | ← | 0 | ← | 10 |
| Photopolymerization initiator (SP172) [mass %] | — | 0.06 | 0.06 | 6 | 0.06 | — |
| Photopolymerization initiator (SP152) [mass %] | — | — | — | — | — | — |
| Photopolymerization initiator (SP300) [mass %] | 0.06 | — | — | — | — | — |
| Thermalpolymerization initiator (San-Aid SI60) [mass %] | — | — | — | — | — | 0.3 |
| Stamper structure | 2 layers | 3 layers | 4 layers | 2 layers | ← | ← |
| Elastic modulus of micro structure layer [Gpa] | N/A | 0.3 | 0.3 | 0.7 | 0.3 | 0.3 |
| Light transmissivity of micro structure layer [%] (wavelength: 365 nm thickness: 30 μm) | 92.6 | 92.9 | 92.9 | 67.3 | 91.3 | 90.6 |
| Maximum dimension change rate [%] | N/A | N/A | N/A | 2.0 | 25.9 | 16.2 |
| Availability of transmissivity (transmissivity of equal to or greater than 80%) | ○ | ○ | ○ | x | ○ | ○ |
| Possibility of five-time repetitive transfer (change rate of equal to or less than 10%) | x | x | x | ○ | x | x |

By using the above-explained resin composition, it was attempted to manufacture the nano-imprinting resin stamper 3 having the micro structure layer 2 through the same method as that of the first example, but the micro structure layer 2 had the resin composition which was not cured sufficiently through ultraviolet light irradiation under the same condition as that of the first example.

Also, in the prepared nano-imprinting resin stamper 3, an elastic modulus [GPa] of the micro structure layer 2, a light transmissivity [%], the availability of transmissivity, and the possibility of five-time repetitive transfer were measured. The results are shown in table 3 and table 4.

Note that, in these comparative examples, since the micro structure layer 2 had the resin composition which was not cured sufficiently, a maximum dimension change rate [%] was not measured. Also, the possibility of five-time repetitive transfer was determined and indicated by a cross mark in the table.

Eighth Comparative Example

In the eighth comparative example, unillustrated nano-imprinting resin stamper of a three-layer structure like the seventh example was prepared except that the resin composition (see table 3 and table 4) like the third comparative example was prepared and used.

By using the above-explained resin composition, it was attempted to manufacture the nano-imprinting resin stamper through the same method as that of the seventh example, but the micro structure layer had the resin composition which was not cured sufficiently through ultraviolet light irradiation under the same condition as that of the seventh example.

Also, in the prepared nano-imprinting resin stamper, an elastic modulus [GPa] of the micro structure layer, a light transmissivity [%], the availability of transmissivity, and the possibility of five-time repetitive transfer were measured. The results are shown in table 4.

Note that in this comparative example, since the micro structure layer 2 had the resin composition which was not cured sufficiently, a maximum dimension change rate [%] was not measured. Also, the possibility of five-time repetitive transfer was determined and indicated by a cross mark since no transfer was successful.

Ninth Comparative Example

In the ninth comparative example, except that the resin composition (see table 3 and table 4) which was same as the third comparative example was prepared and used, the unillustrated nano-imprinting resin stamper of a four-layer structure was prepared which was same as the eighth comparative example.

By using this resin composition, it was attempted to manufacture the nano-imprinting resin stamper through the same method as that of the eighth example, but the micro structure layer had the resin composition which was not cured sufficiently through ultraviolet light irradiation under the same condition as that of the eighth example.

Also, in the prepared nano-imprinting resin stamper, an elastic modulus [GPa] of the micro structure layer, a light transmissivity [%], the availability of transmissivity, and the possibility of five-time repetitive transfer were measured. The results are shown in table 4.

Note that, in this comparative example, since the micro structure layer 2 had the resin composition which was not cured sufficiently, a maximum dimension change rate [%] was not measured. Also, the possibility of five-time repetitive transfer was determined and indicated by a cross mark since no transfer was successful.

Evaluation Result for Nano-Imprinting Resin Stamper of Example and Comparative Example As shown in table 1 and table 2, the nano-imprinting resin stamper according to the examples of the present invention has a micro structure layer that is formed of a polymer of a resin composition which contains the silsesquioxane derivative as a major constituent and the monomer constituent, and which contains equal to or more than 0.3 mass % and equal to or less than 3 mass % of the photopolymerization initiator relative to the total mass of the silsesquioxane derivative and the monomer constituent, or contains equal to or more than 0.5 mass % and less than 15 mass % of the thermalpolymerization initiator relative to the total mass of the silsesquioxane derivative and the monomer constituent. Hence, the micro structure layer has an ultraviolet light transmissivity that is equal to or greater than 80% at a wavelength of 365 nm.

Therefore, the nano-imprinting resin stamper is capable of efficiently curing the resin layer (the photo-curable resin) of the transfer target where the micropattern is transferred. Hence, according to this nano-imprinting resin stamper, it is possible to maintain a good throughput of the transfer target where the micropattern is transferred.

Also, the nano-imprinting resin stamper according to the examples of the present invention has the micro structure layer that is formed of a polymer of a resin composition which contains the silsesquioxane derivative as a major constituent and the monomer constituent, and which contains equal to or more than 0.3 mass % and equal to or less than 3 mass % of the photopolymerization initiator relative to the total mass of the silsesquioxane derivative and the monomer constituent, or contains equal to or more than 0.5 mass % and less than 15 mass % of the thermalpolymerization initiator relative to the total mass of the silsesquioxane derivative and the monomer constituent. Hence, the transfer precision and the repetitive transfer characteristic become good.

On the other hand, as shown in table 3 and table 4, according to the nano-imprinting resin stamper of the comparative examples, since the content percentage of the photopolymerization initiator and the content percentage of the thermalpolymerization initiator are not within the range of the present invention, the ultraviolet light transmissivity of the micro structure layer at a wavelength of 365 nm becomes insufficient, or the repetitive transfer becomes poor.

Figure 6:
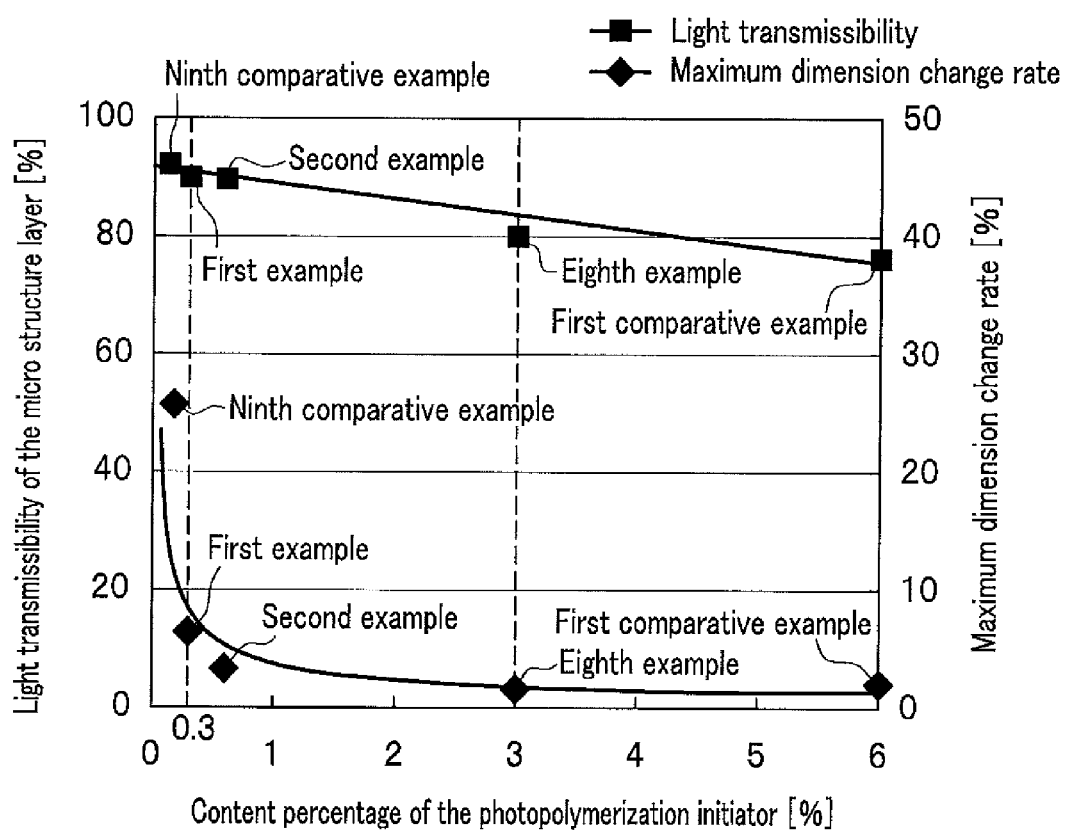
FIG. 6 is a graph indicating a relationship and a content percentage of a photopolymerization initiator in a resin composition that is used for forming a micro structure layer, a light transmissibility of the micro structure layer and a maximum dimension change rate thereof, where a horizontal axis indicates the content percentage [%] of the photopolymerization initiator, a right vertical axis indicates the maximum dimension change rate [%], and a left vertical axis indicates the light transmissibility [%] of the micro structure layer.

Reference is now made to FIG. 6 which is a graph showing a relationship among a content percentage of the photopolymerization initiator in the resin composition that is used for forming the micro structure, a light transmissivity and a maximum dimension change rate of the microstructure. A horizontal axis indicates the content percentage [%] of the photopolymerization initiator, a right vertical axis indicates the maximum dimension change rate [%], and a left vertical axis indicates the light transmissibility [%] of the micro structure layer. More specifically, FIG. 6 is a graph showing the light transmissivity (an ultraviolet light transmissivity) of the micro structure layer and the maximum dimension change rate thereof obtained when the resin composition having the content of the photopolymerization initiator (SP172) changed relative to the total of 100 parts by mass of 90 parts by mass of the silsesquioxane derivative and 10 parts by mass of the monomer constituent was used. Note that in FIG. 6, corresponding example number and comparative example number are put down with each other.

It is also clear from FIG. 6 that the light transmissivity of the microstructure and the maximum dimension change rate (repetitive transfer) thereof become excellent by setting the content percentage of the photopolymerization initiator to be equal to or more than 0.3 mass % and equal to or less than 3 mass %.

What is claimed is:

1. A nano-imprinting resin stamper comprising a micro structure layer on a light-transmissive support basal material, the micro structure layer being formed of a polymer of a resin composition that contains a silsesquioxane derivative having a plurality of polymerizable functional groups, another polymerizable resin component having a plurality of polymerizable functional groups and different from the silsesquioxane derivative, and a photopolymerizable initiator, wherein a content of the silsesquioxane derivative is at least 50 mass % or more of the resin composition, a content percentage of the photopolymerizable initiator is equal to or more than 0.3 mass % and equal to or less than 0.6 mass % relative to a total mass of the silsesquioxane derivative and the polymerizable resin component, and the micro structure layer permits equal to or more than 80% of light to pass therethrough at a wavelength of 365 nm.

2. The nano-imprinting resin stamper according to claim 1, wherein the photopolymerizable initiator is a photo cation polymerizable initiator.

3. The nano-imprinting resin stamper according to claim 1, wherein the polymerizable functional group is selected from at least one kind of followings: a vinyl group; an epoxy group; an oxetanyl group; a vinyl-ether group; and a (meta) acrylic group.

4. The nano-imprinting resin stamper according to claim 1, wherein the nano-imprinting resin stamper further comprises a light-transmissive elastic body plate and a light-transmissive substrate provided in that order on a surface opposite to the surface of the support basal material where the micro structure layer is formed.

5. A nano-imprinting apparatus comprising:
the nano-imprinting resin stamper according to claim 1;
a fixing block that fixes the nano-imprinting resin stamper;
a stage block that holds a transfer target; and
a driving mechanism that drives at least either one of the fixing block and the stage block so that the nano-imprinting resin stamper is pressed against the transfer target and released from the transfer target thereafter.

6. The nano-imprinting apparatus according to claim 5, wherein the nano-imprinting resin stamper is provided with a light-transmissive elastic body plate and a light-transmissive substrate in that order on a surface opposite to the surface of support basal material where the micro structure layer is formed.

7. A nano-imprinting resin stamper comprising a micro structure on a light-transmissive support basal material, the micro structure layer being formed of a polymer of a resin composition that contains a silsesquioxane derivative having a plurality of polymerizable functional groups, another polymerizable resin component having a plurality of polymerizable functional groups and different from the silsesquioxane derivative, and a thermalpolymerizable initiator, wherein a content of the silsesquioxane derivative is at least 50 mass % or more of the resin composition, a content percentage of the photopolymerizable initiator is equal to or more than 0.3 mass % and equal to or less than 0.6 mass % relative to a total mass of the silsesquioxane derivative and the polymerizable resin component, the content percentage of the thermalpolymerizable initiator is equal to or more than 0.5 mass % and less than 15 mass % relative to a total mass of the silsesquioxane derivative and the polymerizable resin component, and the micro structure layer permits equal to or more than 80% of light to pass therethrough at a wavelength of 365 nm.

8. The nano-imprinting resin stamper according to claim 7, wherein the thermalpolymerizable initiator is a thermal cation polymerizable initiator.

9. The nano-imprinting resin stamper according to claim 7, wherein the polymerizable functional group is selected from at least one kind of followings: a vinyl group; an epoxy group; an oxetanyl group; a vinyl-ether group; and a (meta) acrylic group.

10. The nano-imprinting resin stamper according to claim 7, wherein the nano-imprinting resin stamper further comprises a light-transmissive elastic body plate and a light-transmissive substrate provided in that order on a surface opposite to the surface of the support basal material where the micro structure layer is formed.

11. A nano-imprinting apparatus, comprising:
the nano-imprinting resin stamper according to claim 7;
a fixing block that fixes the nano-imprinting resin stamper;
a stage block that holds a transfer target; and
a driving mechanism that drives at least either one of the fixing block and the stage block so that the nano-imprinting resin stamper is pressed against the transfer target and released from the transfer target thereafter.

12. The nano-imprinting apparatus according to claim 11, wherein the nano-imprinting resin stamper is provided with a light-transmissive elastic body plate and a light-transmissive substrate in that order on a surface opposite to the surface of support basal material where the micro structure layer is formed.

13. The nano-imprinting apparatus according to claim 12, wherein the light-transmissive substrate is formed of glass, silica, an acrylate resin or vinyl chloride, and the support basal material is formed of glass or silica.

14. The nano-imprinting apparatus according to claim 10, wherein the light-transmissive substrate is formed of glass, silica, an acrylate resin or vinyl chloride, and the support basal material is formed of glass or silica.

15. The nano-imprinting apparatus according to claim 6, wherein the light-transmissive substrate is formed of glass, silica, an acrylate resin or vinyl chloride, and the support basal material is formed of glass or silica.

16. The nano-imprinting resin stamper according to claim 4, wherein the light-transmissive substrate is formed of glass, silica, an acrylate resin or vinyl chloride, and the support basal material is formed of glass or silica.

* * * * *